US007197595B2

(12) United States Patent
Asari et al.

(10) Patent No.: US 7,197,595 B2
(45) Date of Patent: Mar. 27, 2007

(54) NONVOLATILE MEMORY AND METHOD OF ADDRESS MANAGEMENT

(75) Inventors: Shinsuke Asari, Akishima (JP); Takayuki Tamura, Higashiyamato (JP); Atsushi Shiraishi, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 344 days.

(21) Appl. No.: 10/721,362

(22) Filed: Nov. 26, 2003

(65) Prior Publication Data
US 2004/0177216 A1    Sep. 9, 2004

(30) Foreign Application Priority Data
Mar. 3, 2003    (JP)    ............... 2003-055129

(51) Int. Cl.
G06F 12/00    (2006.01)
(52) U.S. Cl. ............. 711/103; 711/150; 711/206
(58) Field of Classification Search ........... 711/103, 711/150, 206
See application file for complete search history.

(56) References Cited
U.S. PATENT DOCUMENTS
5,590,073 A * 12/1996 Arakawa et al. ....... 365/185.08
6,052,798 A * 4/2000 Jeddeloh ................ 714/8
6,725,321 B1 * 4/2004 Sinclair et al. ........ 711/103
6,748,505 B1 * 6/2004 Dakhil .................. 711/167
6,898,662 B2 * 5/2005 Gorobets ............... 711/103
6,901,479 B2 * 5/2005 Tomita ................. 711/114
6,968,421 B2 * 11/2005 Conley ................. 711/103
2001/0036105 A1 * 11/2001 Takata ................ 365/185.11

FOREIGN PATENT DOCUMENTS
JP    2000-099215    7/2000
JP    2002-197876    7/2002

* cited by examiner

Primary Examiner—Stephen C. Elmore
Assistant Examiner—Daniel Kim
(74) Attorney, Agent, or Firm—Miles & Stockbridge P.C.

(57) ABSTRACT

A nonvolatile memory has plural memory blocks, each having a plurality of sub memory blocks, and is capable of programming to a first sub memory block within a first memory block and a second sub memory block within a second memory block in parallel. The first sub memory block has a management area for storing a management information including linking information between the first sub memory block corresponding sub memory blocks of other memory blocks. A control circuit controls reading the linking information from the first sub memory block in accordance with address information, and programming to the first sub memory block in accordance with the address information and corresponding sub memory blocks by the linking information.

10 Claims, 16 Drawing Sheets

FIG. 6(A)

| | 0 | 1 | 2 | 3 | 4 | 5 | 6 | 7 | | 14 | 15 | |
|---|---|---|---|---|---|---|---|---|---|---|---|---|
| "SURFACE" | GOOD BLOCK INFORMATION | | DATA TYPE IDENTIFICATION INFORMATION | WRITE PROTECT FLAG | | | | ... | | | } S-MDM |
| "REVERSE" | GOOD BLOCK INFORMATION | | PAGE ADDRESS OF BANK 1 | | PAGE ADDRESS OF BANK 2 | | PAGE ADDRESS OF BANK 3 | | ... | | | } R-MDM |

MGA · DDA · WPF
MGA · LDA1 · LDA2 · LDA3

BNK0

FIG. 6(B)

| | 0 | 1 | 2 | 3 | 4 | 5 | 6 | 7 | | 14 | 15 | |
|---|---|---|---|---|---|---|---|---|---|---|---|---|
| "SURFACE" | GOOD BLOCK INFORMATION | | | | | | | | ... | | | } S-MDM |
| "REVERSE" | GOOD BLOCK INFORMATION | | | | | | | | ... | | | } R-MDM |

MGA
MGA

BNK1~3

FIG. 10(A)

| CA | 000h | 001h | 002h | 003h | ... | 1FCh | 1FDh | 1FEh | 1FFh |
|---|---|---|---|---|---|---|---|---|---|
| | HBA0~31 | | HBA32~63 | | ... | HBA8128~8159 | | HBA8160~8191 | |
| VALUE | 0000h | | 0050h | | ... | FFFFh | | FFFFh | |

| BIT | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| CONTENTS | PAGE ADDRESS OF BANK 0 | | | | | | | | | | | | | INFORMATION FLAG | | |

FIG. 10(B)

| CA | 000h | | | | | | | | 001h | ... | 1FFh |
|---|---|---|---|---|---|---|---|---|---|---|---|
| | 7 | 6 | 5 | 4 | 3 | 2 | 1 | 0 | | | |
| VALUE | 0 | 1 | 0 | 0 | 1 | 1 | 0 | 0 | 0 | ... | 0 |

NONVOLATILE MEMORY AND METHOD OF ADDRESS MANAGEMENT

BACKGROUND OF THE INVENTION

The present invention relates to technology effectively applied to an address management method in an electrically writable and erasable nonvolatile semiconductor storage device. Still, the present invention relates to technology effectively applied to a storage device such as, e.g., a memory card incorporating a flash memory having plural banks from which data can be erased collectively in a predetermined unit.

Recently, as data storage media of portable electronic equipment such as digital cameras, card-type storage devices called memory cards have become widely used. The memory cards incorporate a nonvolatile memory such as a flash memory capable of holding stored data even if power is turned off. Most of the memory cards generally incorporate a nonvolatile memory and a controller to control the writing and reading of data to and from the nonvolatile memory.

A flash memory incorporated in conventional memory cards, which generally has one memory array, is configured to perform writing in a unit (hereinafter referred to as a block) of a memory cell group connected to an identical word line within the memory array (Patent Publication 1). Therefore, the controller to control the writing and reading of data to and from such a flash memory manages addresses on a block basis.

There is an increasing demand for larger-capacity semiconductor memories. Although one method for achieving large-capacity semiconductor memories is to increase the number of memory cells forming one memory array, there is a problem in that bit lines and word lines become longer, resulting in longer data read time. On the other hand, there is a method (multi-bank method) of achieving large-capacity semiconductor memories by providing plural memory arrays (hereinafter referred to as banks) within one chip.

Such a multi-bank method is advantageous in that data read time can be reduced because bit lines and word lines within banks do not become so long, and write time and erase time can be reduced because write operation or erase operation is performed in parallel among plural banks.

[Patent Publication 1]

Japanese Unexamined Patent Publication No. 2002-197876

SUMMARY OF THE INVENTION

The inventor studied an address management method in a memory system such as a memory card using a flash memory adopting the multi-bank method. As a result, it became obvious that the multi-bank method has problems as described below.

FIG. 15 shows an address assignment method in a system using a conventional flash memory. In a flash memory of FIG. 15, memory cells capable of storing 2112-byte data are connected to one word line within a memory array to form one block, and e.g., 16384 of such a block are provided such that the flash memory has a storage capacity of 128 M bits. In this case, an external controller specifies the blocks to be written by 14-bit addresses 0000h to 1FFFh associated with the blocks.

If a flash memory having four banks is managed by such a block-based address method, parallel writing among plural banks will be unable to be performed. Accordingly, as shown in FIG. 16, four buffer memories BFM0 to BFM3 comprising SRAM or the like are provided correspondingly to four banks BANK0 to BANK3, and identical blocks of different banks are coupled (grouped) so as to be associated with one address, thereby enabling parallel writing among plural banks.

By the way, each block of conventional flash memories is generally provided with an area MDA (see FIG. 15) for storing management information indicating whether or not the block contains defective bits so that information of the management area is checked before writing is performed. Assume that such a method is applied to a flash memory of the multi-bank method as described previously. Since writing cannot be normally performed if defective memory cells (hereinafter referred to as defective bits) are contained in any of four coupled blocks, information of management areas of all blocks must be checked each time writing is performed.

As a result, much time is required to check information of the management areas, and if the ratio of defective bits to normal memory cells (hereinafter referred to as normal bits) is the same among banks, since a defect does not always occur in an identical location in each bank, the probability of occurrence of defective addresses in the entire memory will become higher, and it will take longer to perform writing processing.

Accordingly, as shown in FIG. 16, an address management method is conceivable which assigns no address if defective bits are contained in any of four blocks mutually coupled. In FIG. 16, hatched blocks are blocks containing defective bits. However, according to the address management method, the number of blocks that contain no defective bits but are not used increases, so that a substantial storage capacity decreases. In FIG. 16, blocks marked with x are blocks that contain no defective bits but are not used.

Known methods of managing flash memory addresses are twofold. One method, referred to as a logical-to-physical method, sequentially establishes a one-to-one correspondence between physical addresses and logical addresses of blocks as shown in FIGS. 15 and 16. Another method, referred to as a table method, uses a reference table giving correspondences between physical addresses and logical addresses to perform translation from logical addresses into physical addresses for accessing blocks. In such a table method, if physical addresses about all blocks within the flash memory were stored, the amount of data of the reference table would increase.

If the amount of data of the reference table increases, since the reference table is generally stored within the flash memory, there arises a problem that an area available to users within the flash memory reduces, and the capacity of memory such as external RAM for expanding the reference table increases. The reference table is expanded in an external memory because frequent references to the reference table within the flash memory would make access time longer because the flash memory is slower in access speed than RAM.

An object of the present invention is to provide an address management method which makes it possible to prevent reduction in a substantial storage capacity due to an increase in the number of blocks that contain no defective bits but are not used in a memory system that uses an electrically writable and erasable nonvolatile semiconductor storage device having plural banks, such as flash memory.

Another object of the present invention is to provide an address management method which makes it possible to prevent reduction in a substantial storage capacity by decreasing the amount of data of a reference table for address translation in a memory system that uses an electrically writable and erasable nonvolatile semiconductor storage device having plural banks, such as flash memory, and adopts the table method.

Still another object of the present invention is to provide an address management method which makes it possible to reduce a storage capacity of external memory in a memory system that uses an electrically writable and erasable nonvolatile semiconductor storage device having plural banks, such as flash memory.

The foregoing and other objects, and novel features of the present invention will become apparent from this specification and the accompanying drawings.

Representative examples of the invention disclosed in the present application will be briefly described below.

According to a first invention of the present application, in a memory system using a nonvolatile semiconductor storage device having plural banks, such as flash memory, blocks are sequentially selected and grouped one at a time from the start of each bank except blocks containing defective bits, and addresses are sequentially assigned to groups of the blocks from the start thereof to form chains. The above-described one block refers to the entire group of memory cells to be erased collectively. The unit of collective erase may be different from the unit of collective write. Hereinafter, a collection of blocks that are selected and grouped one at a time from each bank is referred to as an inter-bank block chain.

According to the above-described means, since chains of blocks containing no defective bits are formed, the number of blocks that contain no defective bits but are not used can be reduced.

Preferably, one of blocks coupled to each other that belongs to any one bank is provided with a management information storage area to store information (page addresses) indicating which blocks of other banks the block is coupled to. With this arrangement, the positions of other blocks coupled can be obtained simply by reading management information from the block of a bank which has the management information storage area.

BRIEF DESCRIPTION OF THE DRAWINGS

FIG. 6A is a diagram illustrating the configuration of a management information storage part of bank BANK0 in a flash memory of an embodiment;

FIG. 6B is a diagram illustrating the configuration of a management information storage part of banks BANK0 to BANK3;

FIG. 10A is a diagram illustrating the configuration of an address translation table;

FIG. 10B is a diagram illustrating the configuration of an unused table;

DESCRIPTION OF THE PREFERRED EMBODIMENTS

Hereinafter, embodiments of the present invention will be described with reference to the drawings.

Figure 1:
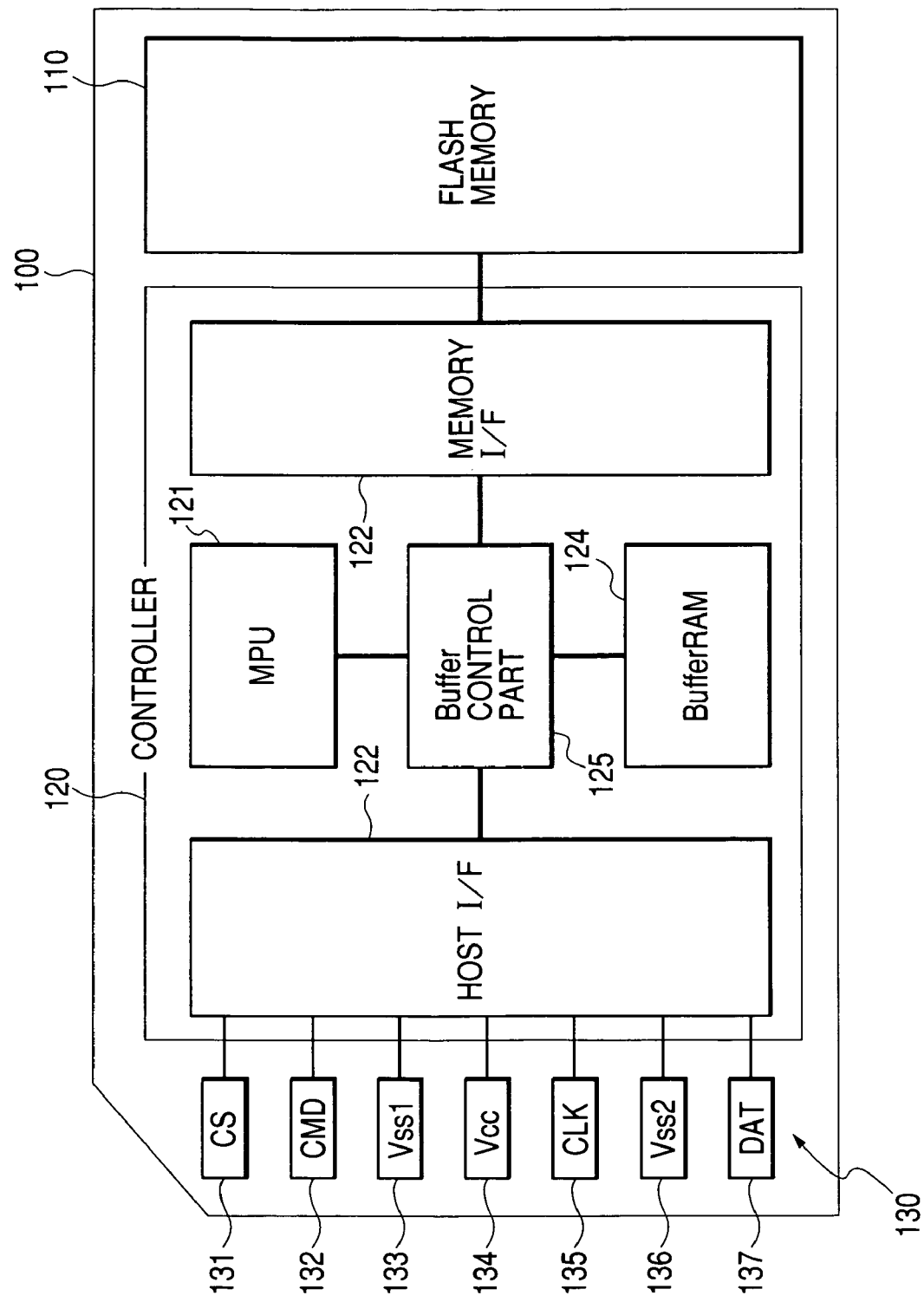
FIG. 1 is a block diagram showing an embodiment of a memory card incorporating a flash memory as a nonvolatile semiconductor storage device to which the present invention is effectively applied.

FIG. 1 shows an embodiment of a memory card incorporating a nonvolatile memory to which the present invention is applied.

Though there is no particular limitation, a memory card 100 in this embodiment comprises a flash memory 110 from which data can be electrically erased collectively in a predetermined unit, and a controller 120 that reads and writes data from and to the flash memory 110 according to commands supplied from the outside. The flash memory 110 and the controller 120 are respectively formed as semiconductor integrated circuits on different semiconductor chips, and the two semiconductor chips, mounted on a board not shown in the figure, are wholly molded in resin or housed in a ceramic package or the like, forming the card.

External terminals 130 are provided at one end of the card. When the card is inserted in a card slot of an external device, the external terminals 130 are electrically connected with circuits of the external device and used to receive power from the external host device to the memory card 100 and input and output signals from and to it. The external terminals 130 are connected to pads as external terminals of the controller 120 by printed wirings or bonding wires formed on the board. Connection between the flash memory 110 and the controller 120 may be made by printed wirings, or may be made by bonding wires with one of the flash memory 110 and the controller 120 mounted on the other.

The controller 120 comprises: a microprocessor (MPU) 121 controlling the operation of the card such as data transfer; a host interface part 122 exchanging signals with external devices; a memory interface part 123 exchanging signals with the flash memory 120; a buffer memory 124 comprising a RAM (random access memory) or the like for temporarily holding commands and write data inputted from the outside, and read data read from the flash memory 110; and a buffer control part 125 controlling the writing and reading of data to and from the buffer memory 124. The buffer control part 125 may be provided with an error correcting code generating and error correcting circuit having a function to generate error correcting codes for write data to the flash memory 110, and check and correct read data on the basis of the error correcting codes.

The flash memory 110 may incorporate a so-called flash controller that controls data writing and reading according to commands from the MPU 121. In the case of a flush memory not incorporating the flash controller, the function of the flash controller may be included in the buffer control part 125 or the MPU 121.

The flash memory 110 is configured to operate based on commands and control signals. Commands effective to the flash memory are a read command, write command, erase command, and the like. These commands and control signals are issued from the MPU 121 or the like.

In FIG. 1, external terminals provided in a card memory called a conventional Multi Media Card (trademark) are shown for the sake of convenience. External terminals provided in a memory card to which the present invention can apply are not limited to those shown in FIG. 1 and may be, e.g., plural input-output terminals capable of parallel data transfer.

Figure 2:
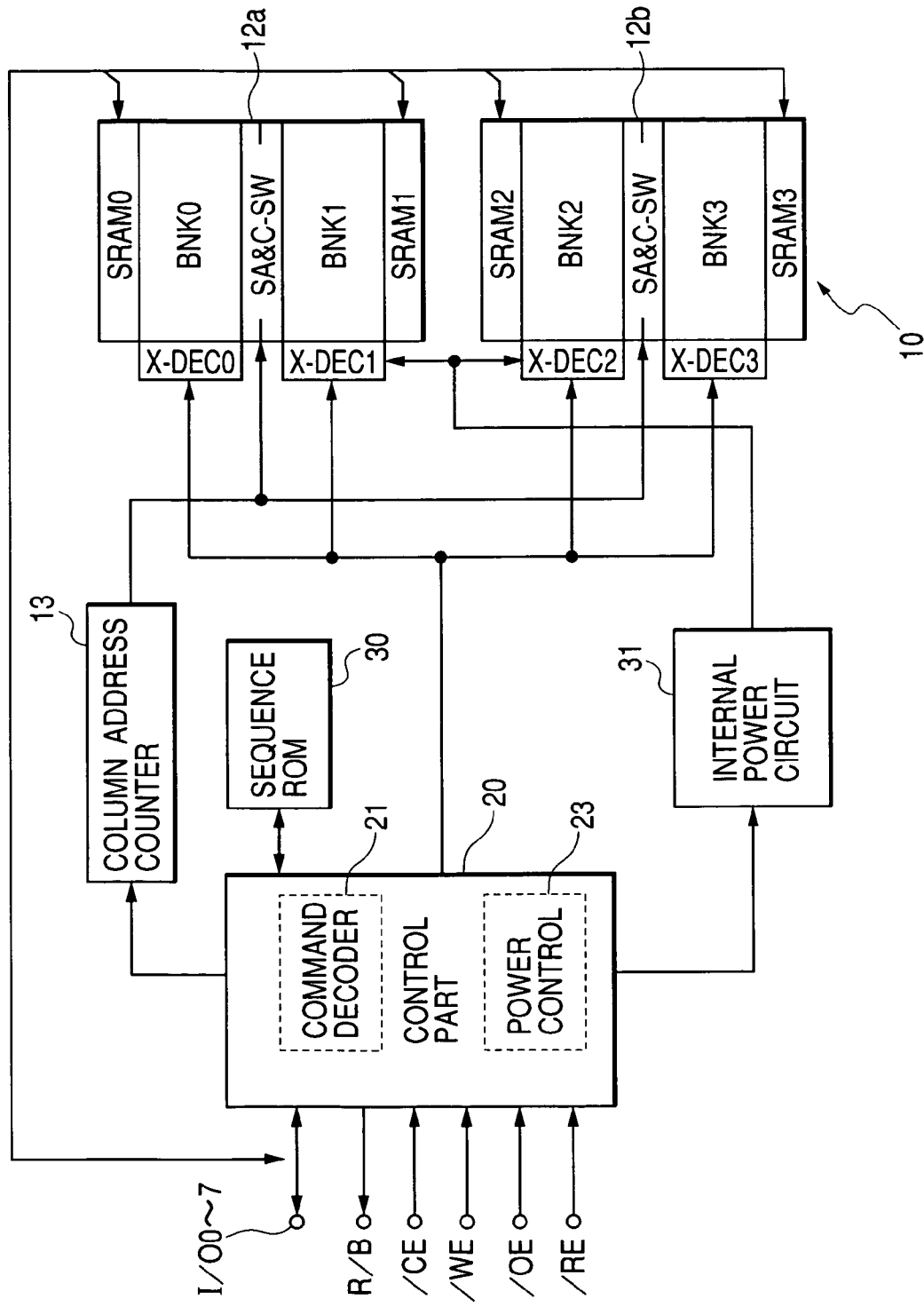
FIG. 2 is a block diagram showing the configuration of a flash memory incorporated in a memory card of an embodiment.

FIG. 2 is a diagram showing a schematic configuration of the flash memory 110 incorporated in the memory card. Although some flash memories are binary-valued memories capable of storing 1-bit data in one memory cell, a flash memory in this embodiment is configured as a quaternary-valued memory capable of storing 2-bit data in one memory cell, and is formed on one semiconductor chip such as single crystalline silicon.

In FIG. 2, a reference numeral 10 designates a memory array in which plural nonvolatile memory elements (memory cells) are disposed in matrix form. In this embodiment, the memory array 10 consists of four banks BANK0, BANK1, BANK2, and BANK3. X-DEC0, X-DEC1, X-DEC2, and X-DEC3 are X address decoders that decode address (X address) signals and drive a corresponding word line within the memory array 10 into a selection level. The X address decoders X-DEC0 to X-DEC3 include a word driver circuit that drives a word line within the memory array into a selection level.

Memory cells making up the memory array 10 consist of MOSFETs each having a floating gate and a control gate, and store 2-bit information because threshold voltages are set to one of four levels according to the amount of charges injected into the floating gate.

In this specification, the lowest threshold voltage is referred to as an erase state. In short, an operation to lower a threshold voltage is referred to as erase and an operate to boost as write or write back. In the flash memory of this embodiment, memory cells are temporarily erased and then applied with a write voltage so as to produce a threshold voltage corresponding to data when the data in the memory array 10 is rewritten.

In FIG. 2, the reference numerals 12*a* and 12*b* designate sense amplifiers & column switches (SA&C-SW) connected to global bit lines within the memory array 10 that hold write data and amplify read signals, and select write data and read data from plural memory cells connected to one word line in a predetermined unit such as bytes and words. SRAM0, SRAM1, SRAM2, and SRAM3 designate buffer memories (hereinafter referred to as SRAM buffers) comprising a static RAM or the like that are provided correspondingly to the banks BANK0, BANK1, BANK2, and BANK3, and hold write data inputted from the outside and read data amplified by the sense amplifiers 12*a* and 12*b* in units of, e.g., pages. 13 designates a column address counter that generates column address signals on the basis of address signals from the outside or automatically inside the flash memory.

20 designates a control part includes: a command decoder 21 to decode command codes inputted through the input-output terminals I/O0 to I/O7 from the outside; an internal power control circuit 23 to control an internal power circuit; and other components. The control part 20 generates control signals within the chip according to inputted commands. 30 designates sequence ROM that stores control sequences of the control part 20 in a format such as microprograms. 31 designates an internal power circuit that generates high voltages (including negative voltages) required during data writing and erasing.

The input-output terminals I/O0 to I/O7 are used to input the above-described commands, write data, and addresses, and output read data. Write data inputted to the input-output terminals I/O0 to I/O7 from the outside during writing is supplied to banks of the memory array 10 via the SRAM buffers SRAM0 to SRAM3 and the sense amplifiers 12*a* and 12*b*, and a write address is temporarily inputted to the control part 20 and then supplied to the address decoders X-DEC0 and X-DEC3.

The flash memory in this embodiment is provided with control terminals through which control signals inputted from the outside, such as a chip selection signal/CE, write control signal/WE, output control signal/OE, and read control signal/RE are inputted. Control signals inputted to the control terminals are supplied to the control part 20, and the operation of the chip is controlled according to the control signals. Though there is no particular limitation, signals represented by symbols preceded by "/" denote that a low level is an effective level. From the control part 20, a ready/busy signal R/B is outputted to outside the chip. The ready/busy signal R/B indicates whether or not a command can be inputted to the flash memory chip.

Figure 3:
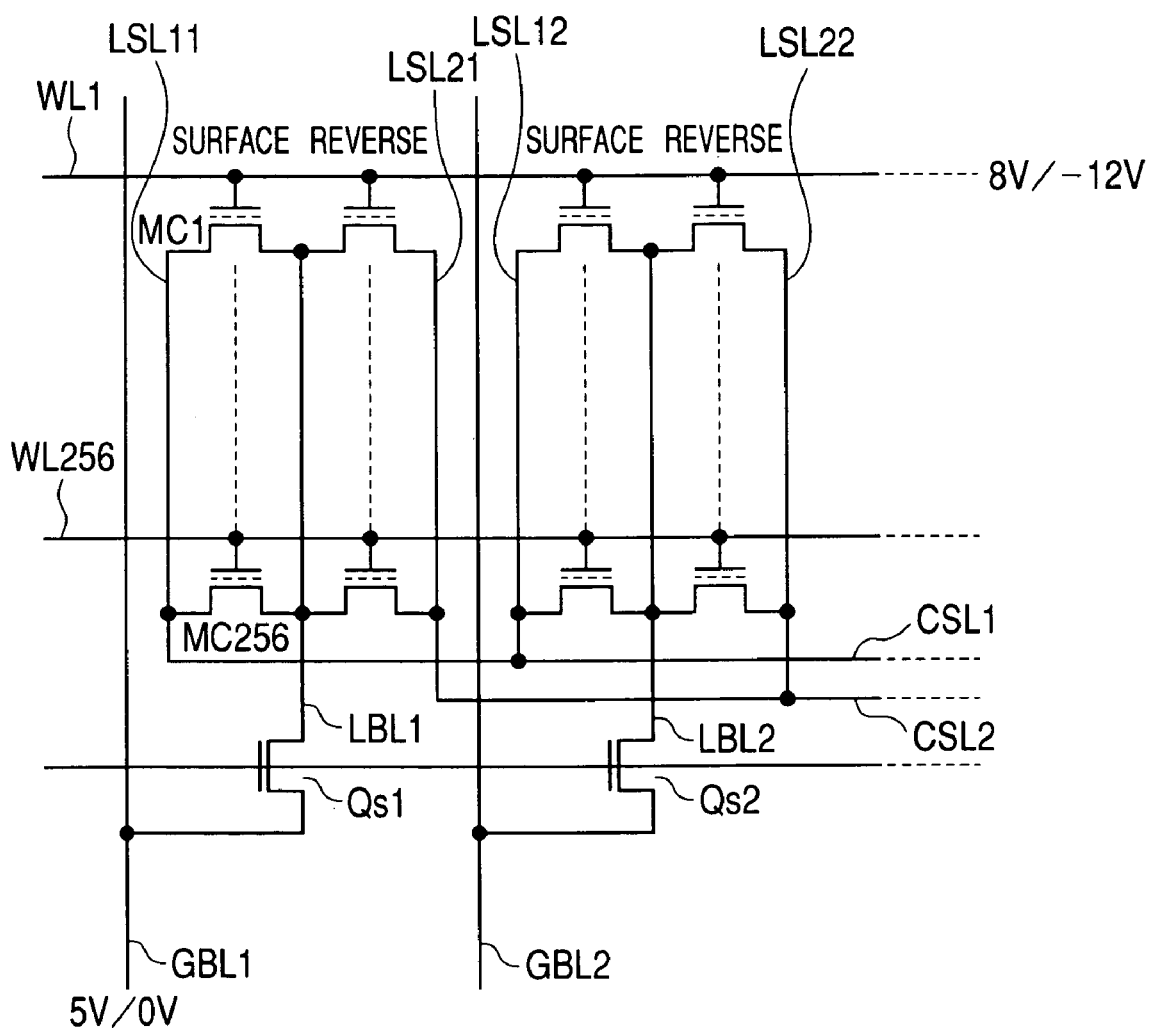
FIG. 3 is a schematic circuit diagram showing the configuration of a memory array of a flash memory of an embodiment.

FIG. 3 shows the configuration of one bank of the memory array of the flash memory 110 used in the memory card of this embodiment.

As shown in FIG. 3, in one bank of the memory array of the flash memory 110, e.g., 4224 memory columns each consisting of 256 memory cells MC1 to MC256 are disposed in parallel in the direction of word lines between local bit lines LBL1, LBL2, and so forth and local source lines LSL111, LSL21, and so forth. In this specification, a group of the 256 by 4224 memory cells is referred to as a subblock. Memory cells of a lateral direction or same rows are respectively connected to common word lines WL1, WL2, ..., WL256. In this specification, a memory cell group connected to an identical word line is referred to as a block. The flash memory of this specification is configured to be erased in blocks. 40 subblocks are provided per bank.

In the memory array of this embodiment, of memory columns each consisting of 256 memory cells, drain terminals of memory cells of odd columns and those of even columns that are adjacent to each other are connected to common local bit lines LBL1, LBL2, and so forth. The local bit lines LBL1, LBL2, and so forth are respectively made connectable to corresponding global bit lines GBL1, GBL2, and so forth via selection MOSFET Qs1, Qs2, and so forth.

Although not shown in the figure, local bit lines of corresponding memory columns within a subblock of the same configuration are made connectable to the global bit lines GBL1, GBL2, and so forth.

Source terminals of memory cells of odd columns are connected to local source lines LSL11, LSL12, and so forth, and source terminals of memory cells of even columns are connected to local source lines LSL21, LSL22, and so forth. Local source lines LSL11, LSL12, and so forth of odd columns are connected to a first common source line CSL1, and local source lines LSL21, LSL22, and so forth of even columns are connected to a second common source line CSL2. The first common source line CSL1 and the second common source line CSL2 are applied with an identical voltage (0V) during data erasing, and during data writing, one of them is applied with a write voltage (0V) and the other is applied with a write rejection voltage (3V). Thereby, a write unit is half an erase unit.

During writing or erasing, one of 256 word lines within a subblock is selected; during writing, a positive high voltage such as 8V is applied, and during erasing, a negative high voltage such as −12V is applied. Thereby, erasing is performed in blocks or for 4224 memory cells connected to one word line, while writing is performed for half (2112) of 4224 memory cells connected to one word line. Hereinafter, the unit of writing will be referred to as a page. Therefore, one block consists of two pages. A page consisting of memory cells of an odd column of two pages making up one block is referred to as a surface page, while a page consisting of memory cells of an even column are referred to as a reverse page.

Figure 4:
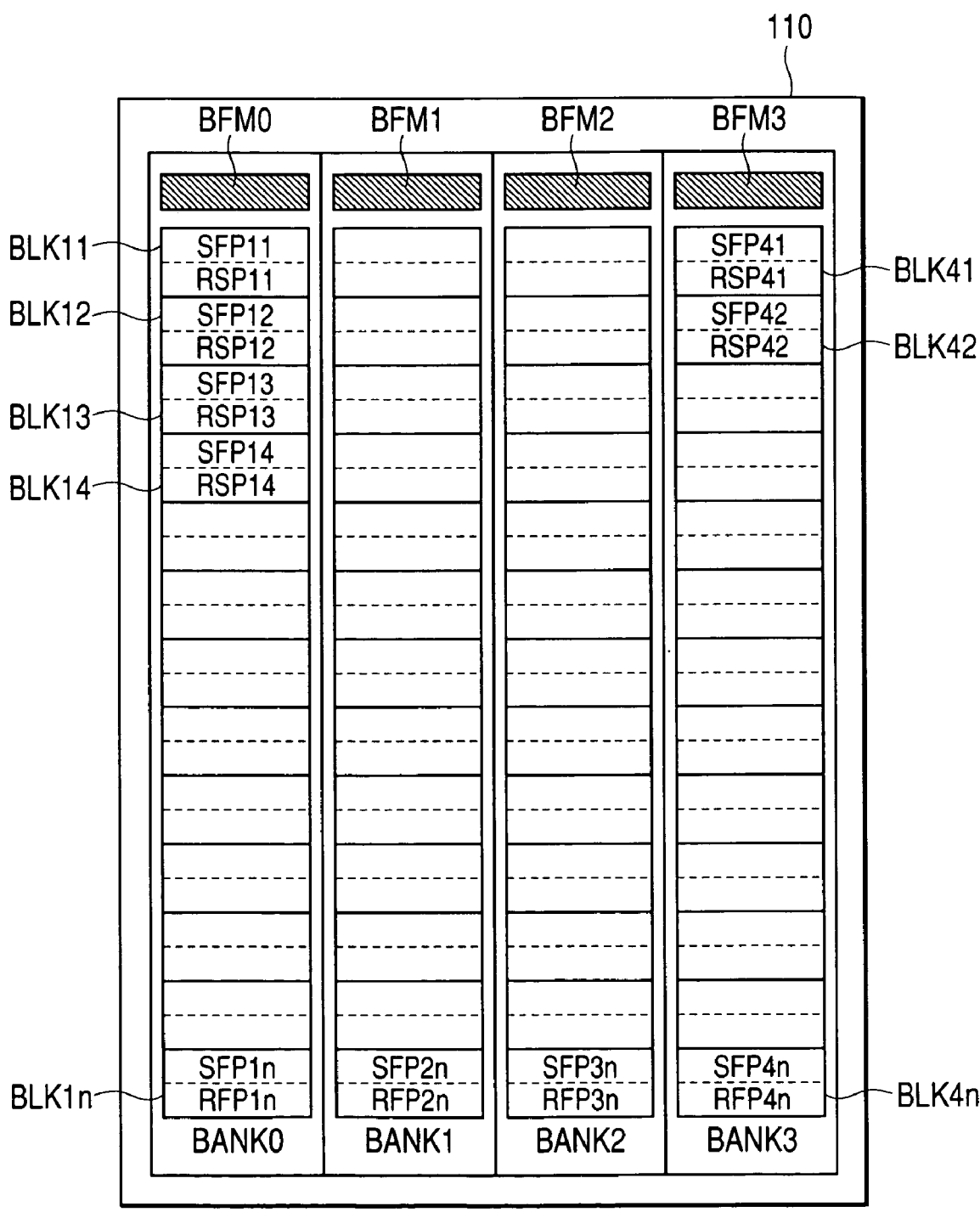
FIG. 4 is a diagram illustrating a relationship between bank configuration and buffer memories of a memory array in a flash memory of an embodiment.

FIG. 4 shows a relationship between the four banks BANK0 to BANK3 and the buffer memories BFM0 to BFM3 in the case where the page is used as a basic unit. For convenience in the figure, in FIG. 4, the number of blocks per bank is not correctly shown. As shown in FIG. 4, the banks BANK0 to BANK3 respectively consist of plural blocks BLK11 to BLK1n, BLK21 to BLK2n, BLK31 to BLK3n, and BLK41 to BLK4n, and each block consists of a surface page SFP and a reverse page RSP. The bank BANK0 is associated with the buffer BFM0, the bank BANK1 with the buffer BFM1, the bank BANK2 with the buffer BFM2, and the bank BANK3 with the buffer BFM3.

Figure 5A:
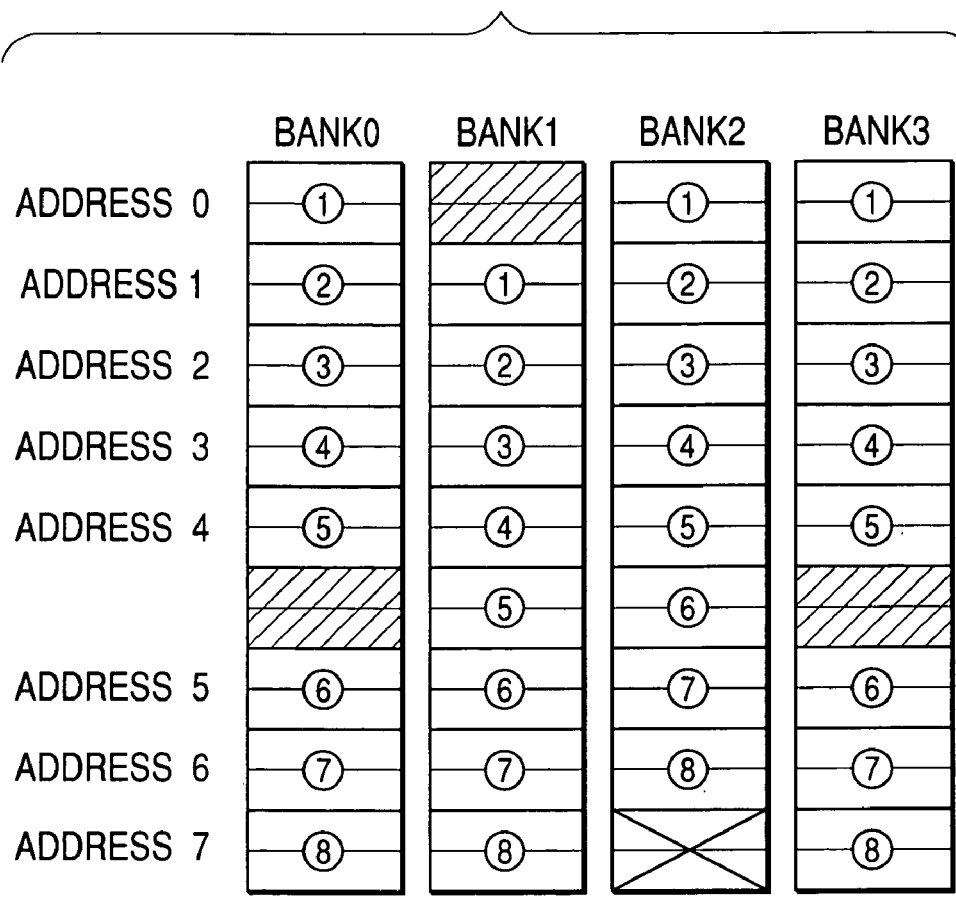
FIG. 5A is a diagram illustrating an address assignment method in a memory card incorporating a flash memory of an embodiment.

FIG. 5A shows an example of an address assignment method in a memory card incorporating a flash memory having the configuration as described above. FIG. 5A shows only the portion of the memory array of the circuits shown in FIG. 4; BANK0 to BANK3 denotes banks, and items marked with a symbol BLK denote blocks. In FIG. 5A, hatched blocks contain defective bits.

Figure 16:
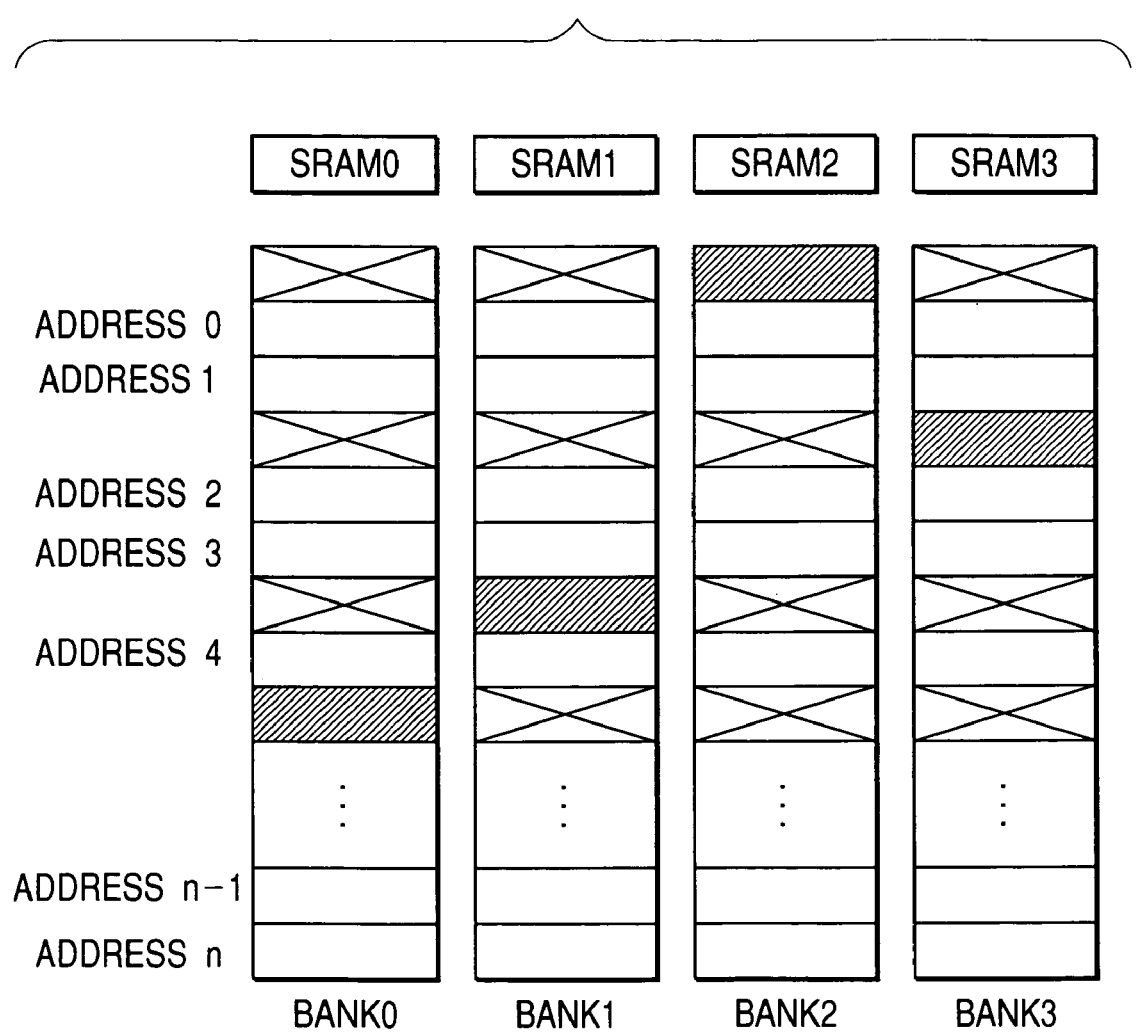
FIG. 16 is a diagram illustrating an address assignment method in a system using a multi-bank flash memory studied before the present invention is made.

As seen from FIG. 5A, in this embodiment, blocks are sequentially selected and grouped one at a time from the start of each bank except blocks containing defective bits, and addresses are sequentially assigned to groups of the blocks from the start thereof until the last block of any one bank is reached. In FIG. 5A, blocks marked with an identical circled digit are selected at the same time by an identical address. As is apparent from comparison with FIG. 16, by applying this embodiment, the number of blocks (blocks marked with x) that contain no defective bits but are not used can be significantly reduced. Unallocated blocks can be used as reserved blocks to be replaced with blocks containing defective bits that occurred later.

Figure 5B:
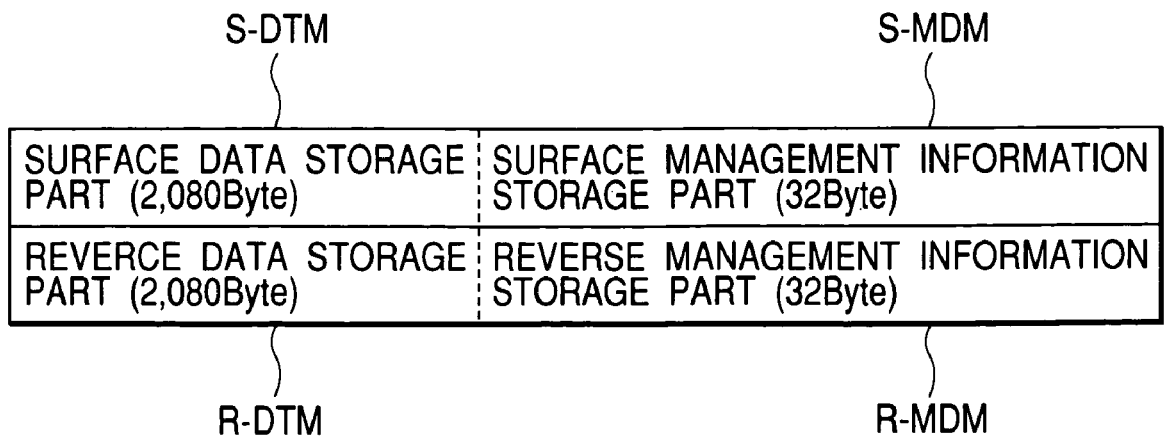
FIG. 5B is a diagram illustrating the configuration of a block within a bank.

As shown in FIG. 5B, each block comprises a surface data storage part S-DTM and a management information storage part S-MDM that are provided on a surface page, and a surface data storage part S-DTM and a management information storage part S-MDM that are provided on a surface page, and a reverse data storage part R-DTM and a management information storage part R-MDM that are provided on a reverse page. Though there is no particular limitation, although the flash memory of this embodiment is a multiple-valued memory configured to be able to store 2-bit data in one memory cell, it is configured to be able to store and read 1-bit data in and from in one memory cell such that the data storage parts S-DTM and R-DTM store 2-bit data in one memory cell and the management information storage parts S-MDM and R-MDM store 1-bit data in one memory cell.

As a result, the storage capacity of the surface data storage part S-DTM and the reverse data storage part R-DTM is 2080 bytes and the storage capacity of the management information storage parts S-MDM and R-MDM is 16 bytes. Storing 1-bit data in one memory cell makes the reliability of read data higher. In other words, in this embodiment, storage data of the management information storage parts S-MDM and R-MDM is more reliable.

FIG. 6A shows the configuration of data storage areas provided in the management information storage parts S-MDM and R-MDM of each block belonging to the bank BANK0, and FIG. 6B shows the configuration of data storage areas provided in the management information storage parts S-MDM and R-MDM of each block belonging to the banks BANK1 to BANK3.

As shown in FIG. 6A, in this embodiment, the management information storage part S-MDM provided in the surface page of the bank BANK0 is provided with: a 2-byte good/bad indication area MGA to store a code indicating that the page is not defective; a 2-byte data identification area DDA to store data type identification information indicating whether data stored in the data storage parts S-DTM and R-DTM of a block concerned is system data or user data; and a write protect flag area WPF indicating whether or not a block concerned does not permit the erasure of data. The remaining area is unused. The unused area may be used to store information indicating whether or not erasure has been made, the number of times a block concerned was erased, and ECC code for error correction.

The management information storage part R-MDM provided in the reverse page of the bank BANK0 is provided with: a 2-byte good/bad indication area MGA to store code (MGM code) indicating that a page concerned is not defective; a chain information storage area RDA1 to store the page address of a corresponding block of the bank BANK1 coupled with a block concerned; a chain information storage area RDA2 to store the page address of a corresponding block of the bank BANK2 coupled with the block concerned; and a chain information storage area RDA3 to store the page address of a corresponding block of the bank BANK3 coupled with the block concerned. The chain information storage areas RDA1, RDA2, and RDA3 each consist of 2 bytes. The remaining 8-byte area is unused.

Hereinafter, a chain of blocks produced by selecting and coupling blocks one at a time from each of the four banks as described above is referred to as an inter-bank block chain and written as FLBA. The inter-bank block chain is written during card manufacturing.

On the other hand, as shown in FIG. 6B, the management information storage parts S-MDM and R-MDM of the banks BANK1 to BANK3 are provided with a 2-byte good/bad indication area MGA to store an MGM code indicating that the respective pages are not defective; the remaining 14-byte area is unused. The management information storage parts S-MDM and R-MDM of the banks BANK1 to BANK3 do not always need to be provided with the good/bad indication area MGA and may be omitted. An MGM code can be stored during creation of an inter-bank block chain.

In the embodiment, the management information storage parts S-MDM and R-MDM of the bank BANK0 are configured as shown in FIG. 6A, and the management information storage parts S-MDM and R-MDM of the banks BANK1 to BANK3 are configured as shown in FIG. 6B. However, the management information storage parts S-MDM and R-MDM of any one of the banks BANK1 to BANK3 may be configured as shown in FIG. 6A and the management information storage parts S-MDM and R-MDM of the remaining three banks may be configured as shown in FIG. 6B. In this case, the chain information storage areas RDA1 to RDA3 of the bank reverse management information storage part R-MDM configured as shown in FIG. 6A are respectively stored with the page addresses of blocks in other three banks BANKs, coupled with a block concerned. In short, the management information storage part configured as shown in FIG. 6A may be provided in any banks and it is not limited to the bank BANK0.

Next, a procedure for writing and reading data to and from the flash memory in which inter-bank block chains are defined in the memory card of this embodiment will be described with reference to the flowcharts of FIGS. 7 and 8. Control based on the flowcharts of FIGS. 7 and 8 is performed by the controller 120.

Figure 7:
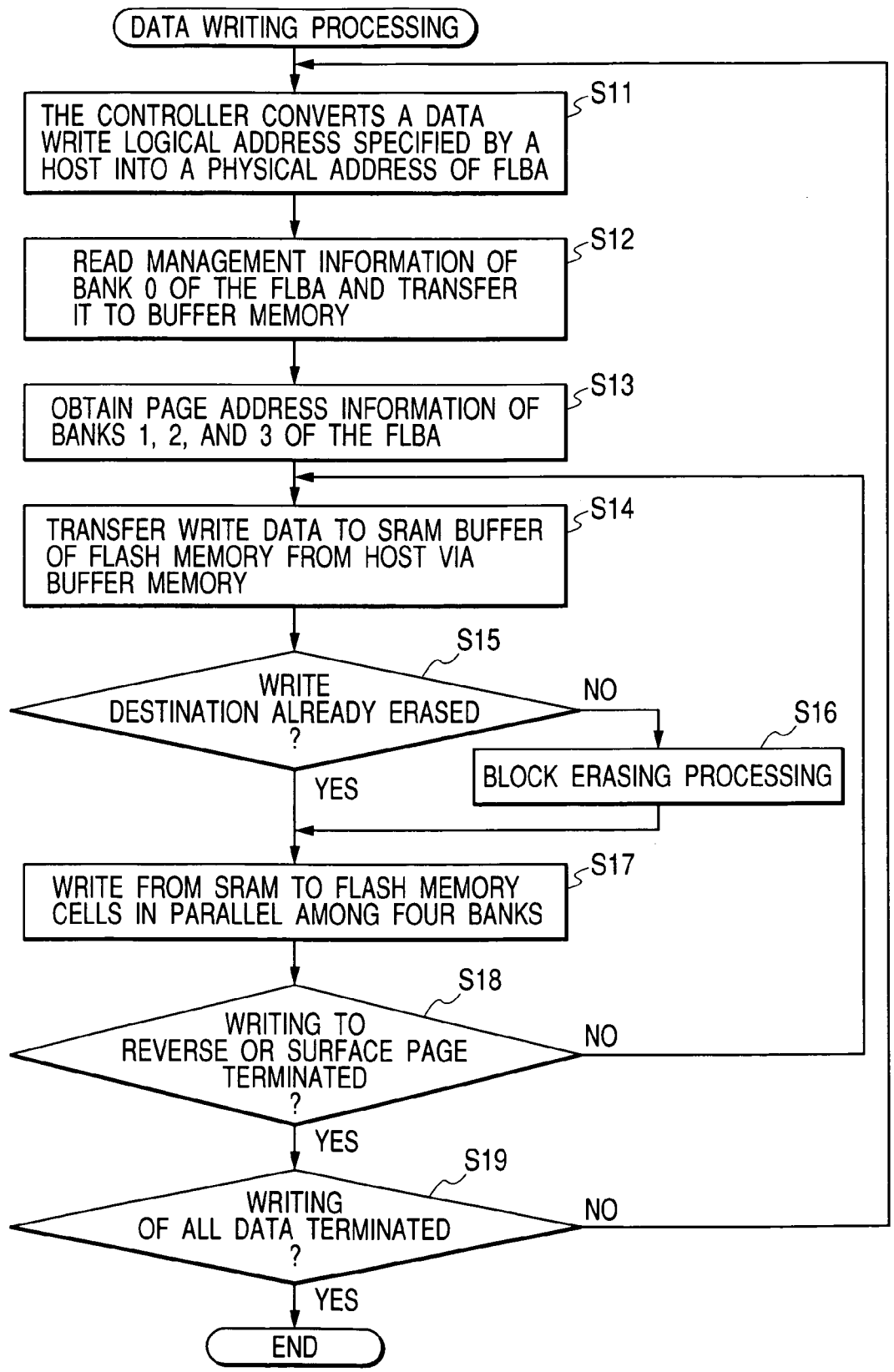
FIG. 7 is a flowchart showing a procedure for data writing processing in a memory card of a first embodiment.
Figure 8:
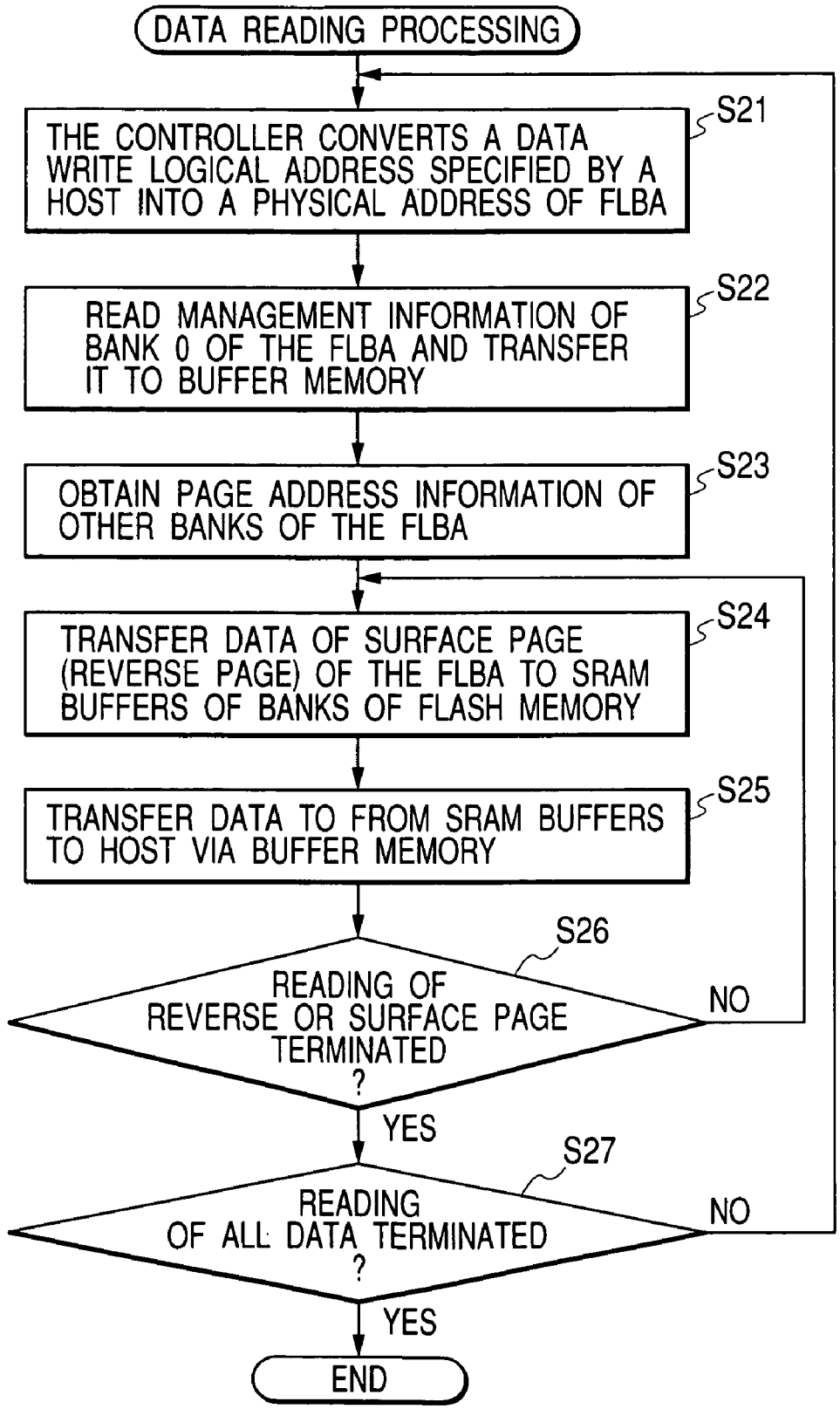
FIG. 8 is a flowchart showing a procedure for data reading processing in a memory card of the first embodiment.

In data writing processing, as shown in FIG. 7, the MPU 121 of the controller 120 translates a logical address inputted from an external host device into a physical address specifying an inter-bank block chain FLBA by performing calculations or consulting a table (step S11).

The flash memory 110 is accessed using the address, and management information stored in the management information storage parts S-MDM and R-MDM of a block of the bank BANK0 of the inter-bank block chain FLBA specified by the address is read into the buffer memory 124 (step S12). From the obtained management information, the page addresses of blocks of the banks BANK1 to BANK3 corresponding to the selected block of the bank BANK0 are obtained (step S13).

Directly obtained from the management information stored in the management information storage parts S-MDM and R-MDM of the block of the bank BANK0 are the page addresses of surface pages (or reverse pages) of corresponding blocks of the banks BANK1 to BANK3. However, since a predetermined relationship exists between the addresses of surface pages and reverse pages, the page address of a reverse page (or surface page) can be obtained by calculations. The page address of the selected block of the bank BANK0 can be obtained in advance by the calculations of the step S11. Thereby, the page addresses of all blocks belonging to the selected inter-bank block chain FLBA can be obtained.

Next, write data inputted from the external host device is transferred to SRAM buffers BFM0 to BFM3 associated with banks of the flash memory 110 via the buffer memory 124 (step S14). It is checked whether or not all memory cells of a block of write destination were data-erased (step S15). The judgment may be made by determining whether or not data of the data storage parts S-DTM and R-DTM read from the flash memory 110 in the step S2 is all zeros, or consulting information of areas, if provided, to store information indicating whether or not data was erased, in the management information storage parts S-MDM and R-MDM of the block of the bank BANK0.

When it is judged in the step S15 that data was erased, process goes to step S17. When data was not erased, in step S16, data of the data storage parts S-DTM and R-DTM of blocks belonging to the banks BANK0 to BANK3 of the inter-bank block chain FLBA is erased, and then process goes to step S17.

In step S17, the page addresses obtained in the step S13 are used to write the write data transferred to the SRAM buffers BFM0 to BFM3 in the step S14 to desired blocks in parallel at the same time among the four banks. Process goes to step S18, where a write verify operation is performed, and it is determined whether or not writing to the surface pages or reverse pages of all selected blocks terminates. Otherwise, process is returned to the step S18 to repeat the above operations (steps S14 to S17). In this embodiment, because of the configuration of the flash memory, writing is performed separately for surface pages and reverse pages. In other words, writing is made to the surface pages of desired blocks of the four banks (step S17), and after the end of writing is confirmed (step S18), writing is made to the reverse pages of the blocks (step S17), then the end of writing is confirmed (step S18).

When it is determined in the step S18 that writing to the surface page and reverse pages terminates, process goes to step S19 to determine whether or not the writing of all data extending to plural blocks terminates. Otherwise, process is returned to the step S11 to repeat the above operations (steps S11 to S17) again. If it is determined in the step S19 that the writing of all data terminates, the writing processing is terminated. If, in the step s11, the logical address is translated into the physical address by consulting a table, and data is made to migrate to other blocks, that is, when the physical address is changed with the logical address unchanged, the table is rewritten after the step S19, and then the writing processing is terminated.

In data reading processing, as shown in FIG. 8, the MPU 121 of the controller 120 translates a logical address inputted from an external host device into a physical address specifying an inter-bank block chain FLBA by performing calculations or consulting a table (step S21).

The flash memory 110 is accessed using the address, and management information stored in the management information storage parts S-MDM and R-MDM of a block belonging to the bank BANK0 of the inter-bank block chain FLBA specified by the address is read into the buffer memory 124 (step S22). From the obtained management information, the page addresses of blocks of the banks BANK1 to BANK3 corresponding to the selected block of the bank BANK0 are obtained (step S23). The steps S21 to S23 are the same as the steps S11 to S13 of the writing processing.

The page addresses obtained in the step S23 are used to transfer page data of the selected blocks read from the memory array of the flash memory 110 to the SRAM buffers BFM0 to BFM3 associated with the banks (step S24). Data of the SRAM buffers BFM0 to BFM3 is transferred to the external host device via the buffer memory 124 (step S25). In this embodiment, because of the configuration of the flash memory, reading is performed separately for surface pages and reverse pages.

It is determined whether or not the reading of the surface pages or reverse pages of all selected blocks terminates. Otherwise process is returned to the step S24 to repeat the above operations (steps S24 to S26) again.

If it is determined in the step S25 that the reading of the surface pages and the reverse pages terminates, process goes to step S26 to determine whether or not reading of all data extending to plural blocks terminates. Otherwise, process is returned to the step S21 to repeat the above operations (steps S21 to S27) again. If it is determined in step s27 that the reading of all data terminates, the reading processing is terminated. In the reading processing, even if translation from the logical address into the physical address was performed by consulting a table, the rewriting of the table does not need to be performed after the step S27.

Next, a second embodiment of the present invention will be described with reference to FIGS. 9 to 15. In the second embodiment, the present invention is applied to a table method which translates a logical address inputted from the outside into a physical address of the flash memory by consulting a translation table. The translation table is stored in the memory array of the flash memory, and when power is turned on, the physical address of FLBA in which the table is stored is registered on a buffer memory 124 or a work RAM within the controller MPU.

Figure 9:
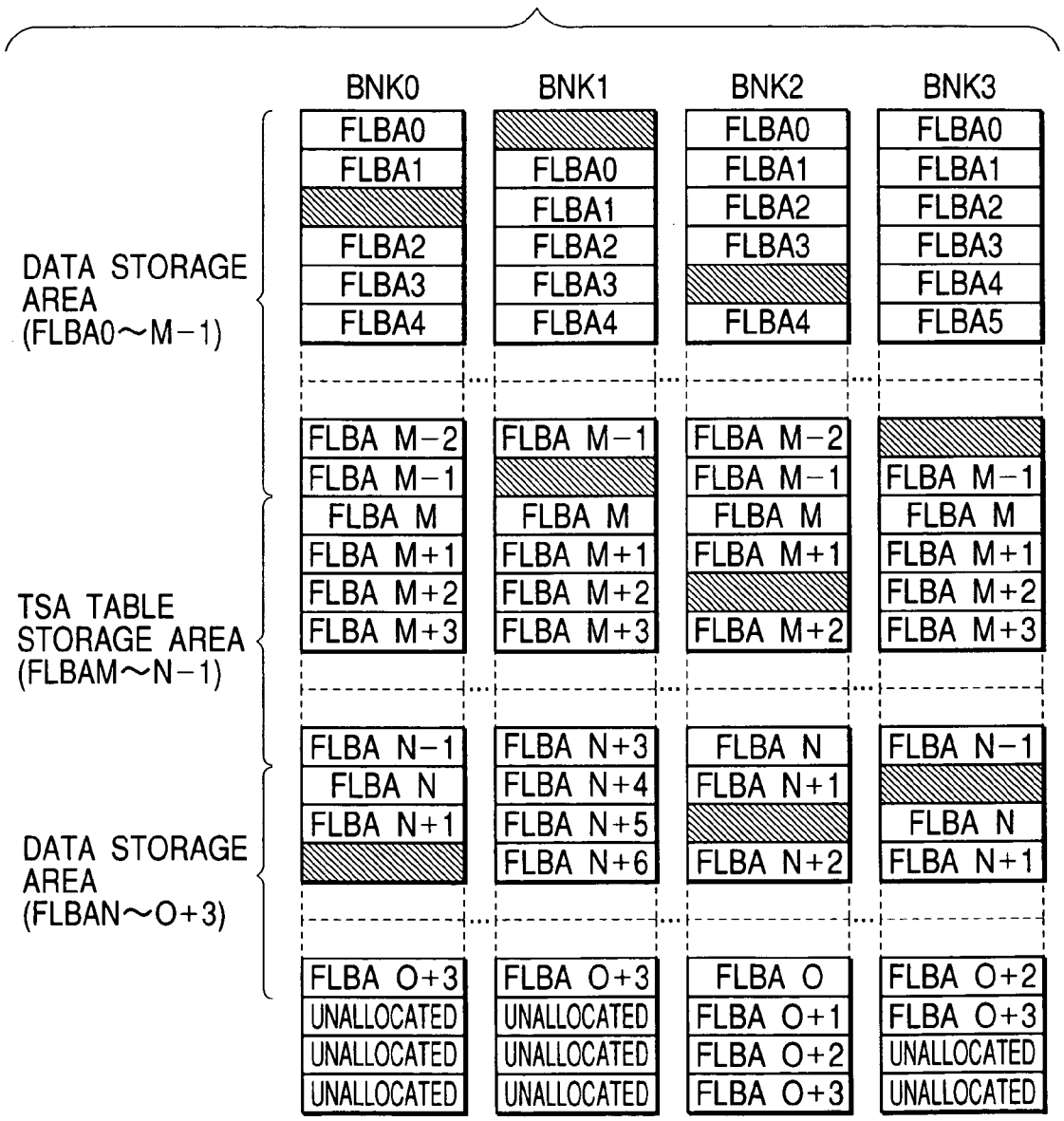
FIG. 9 is a diagram illustrating the configuration of inter-bank block chains of a flash memory in address management of a table method of a second embodiment and allocation examples of table areas.

FIG. 9 shows the configuration of inter-bank block chains of the flash memory in address management of a table method of the second embodiment and allocation examples of table areas.

The configuration of the inter-bank block chains is the same as that in the first embodiment described using FIG. 5A. In FIG. 9, each box marked with the symbol FLBA denotes a block consisting two pages, a surface page and a reverse page. Blocks belonging to different banks that are marked with identical symbols constitutes an identical interbank block chain. Hatched blocks contain defective bits.

As shown in FIG. 9, also in this embodiment, blocks are sequentially selected and grouped one at a time to form chains from the start of each bank except blocks containing defective bits, and addresses are sequentially assigned to the chains from the start thereof until the last block of any one bank is reached.

Furthermore, in the second embodiment, a specific portion of the memory array in which the chains are formed as described above is selected as a table storage area TSA, the specific portion having less blocks containing defective bits, and remaining areas are used as data storage areas.

In a flash memory, defective bits tend to occur locally. Therefore, as described above, by allocating an area for storing important table data to a portion of a subblock that has less blocks containing defective bits, reliability can be increased, and the number of relocations of a table storage area, performed when a block containing defective bits occurs newly, can be reduced, resulting in reduction in waiting time.

Unallocated blocks in the vicinity of the last block of a bank that contain no defective bits but are not used can be used as reserved blocks for replacing blocks containing future defective bits. Tables stored in the table storage area TSA include, in this embodiment, an address translation table and an unused table listing blocks to which data may be written or which may be overwritten.

Though there is no particular limitation, as many address translation tables as the number of subblocks (320) within the memory array are provided, and each address translation table consists of 512 bytes. Since one page of the flash memory of this embodiment is 2112 bytes as described previously, four address translation tables per page and eight per block are stored.

Subblocks in which the address translation tables are stored are decided by a format operation performed during card manufacturing. The position of a subblock in which tables are stored, and the physical address of each table are located by the MPU 121, which refers to data type identification information and the like of the management information storage part of each block at power on, and are registered in a work RAM of the MPU 121 or the buffer memory 124.

FIG. 10A shows the configuration of the above-described address translation tables, and FIG. 10B shows the configuration of an unused table.

In an address translation table of FIG. 10A, the upper field CA denotes a column address, and the lower field "value" denotes a post-translation page address. A number followed by "h" is displayed in hexadecimal. A logical address fed from a host device is associated with a column address of the flash memory, and column addresses are sequentially associated with column addresses from the start thereof.

Since one address translation table is stored in one block and the page address of one inter-bank block chain FLBA is represented by 2 bytes, 256 FLBA page addresses can be registered in one table. This is equivalent to the size of 8192 pre-translation logical addresses. Assuming that logical addresses are inputted in units of 64 bytes from an external host device, address information of 8192 by 64 bytes can be registered in one translation table.

Since one block has a data area of 4096 bytes, eight address translation tables can be stored in one block. On the other hand, the flash memory of the embodiment has 256 blocks in one subblock, one block consists of two pages, and one bank includes 40 subblocks. Therefore, the maximum number of FLBA page addresses is 81920. Accordingly, 320 address translation tables are required and can be stored in 40 blocks, that is, one subblock of any one bank.

In the translation table of FIG. 10A, pre-translation logical addresses HBA0 to HBA31 are assigned to an inter-bank block chain FLBA beginning with a page address of "0000" of the bank BANK0, and pre-translation logical addresses HBA32 to HBA63 are assigned to an inter-bank block chain FLBA beginning with a page address of "0050" of the bank BANK0. Post-translation physical addresses may not be continuous.

In the address translation table of FIG. 10A, the post-translation value of FFFF in the lower field indicates that no page address is assigned. In this embodiment, page addresses of the bank BANK0 can be specified by 13 bits and stored in a 2-byte (16-bit) post-translation address storage area, with the occurrence of a 3-bit extra area, which can be used to store a control information flag relating to the management of inter-bank block chains, such as write protect information.

An unused table contains bits each of which is assigned to each of blocks in the order of physical addresses; a bit of "1" indicates that a corresponding block can be erased, and a bit of "0" indicates that a corresponding block cannot be erased. An unused table of FIG. 10B declares that second, fifth, and sixth blocks of the bank BANK0 can be erased.

One unused table, which consists of 512 bytes (4096 bits), can specify whether or not 4096 blocks may be erased. Since the flash memory of the embodiment has 256 blocks in one subblock and one bank has 40 subblocks, there are 40960 blocks in a total of four banks. Accordingly, 10 unused table are required. On the other hand, since one block has a 4096-byte data area and has a space capable of storing eight unused tables, 10 unused tables can be stored in two blocks. As described previously, all address translation tables can be stored in one subblock of one bank.

Since the flash memory of this embodiment has four banks, if a certain subblock of four banks is used as a table storage area TSA, most areas (about three quarters) of the flash memory will become unused. Accordingly, address translation tables and unused tables can be successively shifted and stored within the table storage area TSA, and such shift operations contribute to prevention of reduction in reliability, caused by an extremely large number of rewritings to specific blocks during table rewriting.

Figure 11:
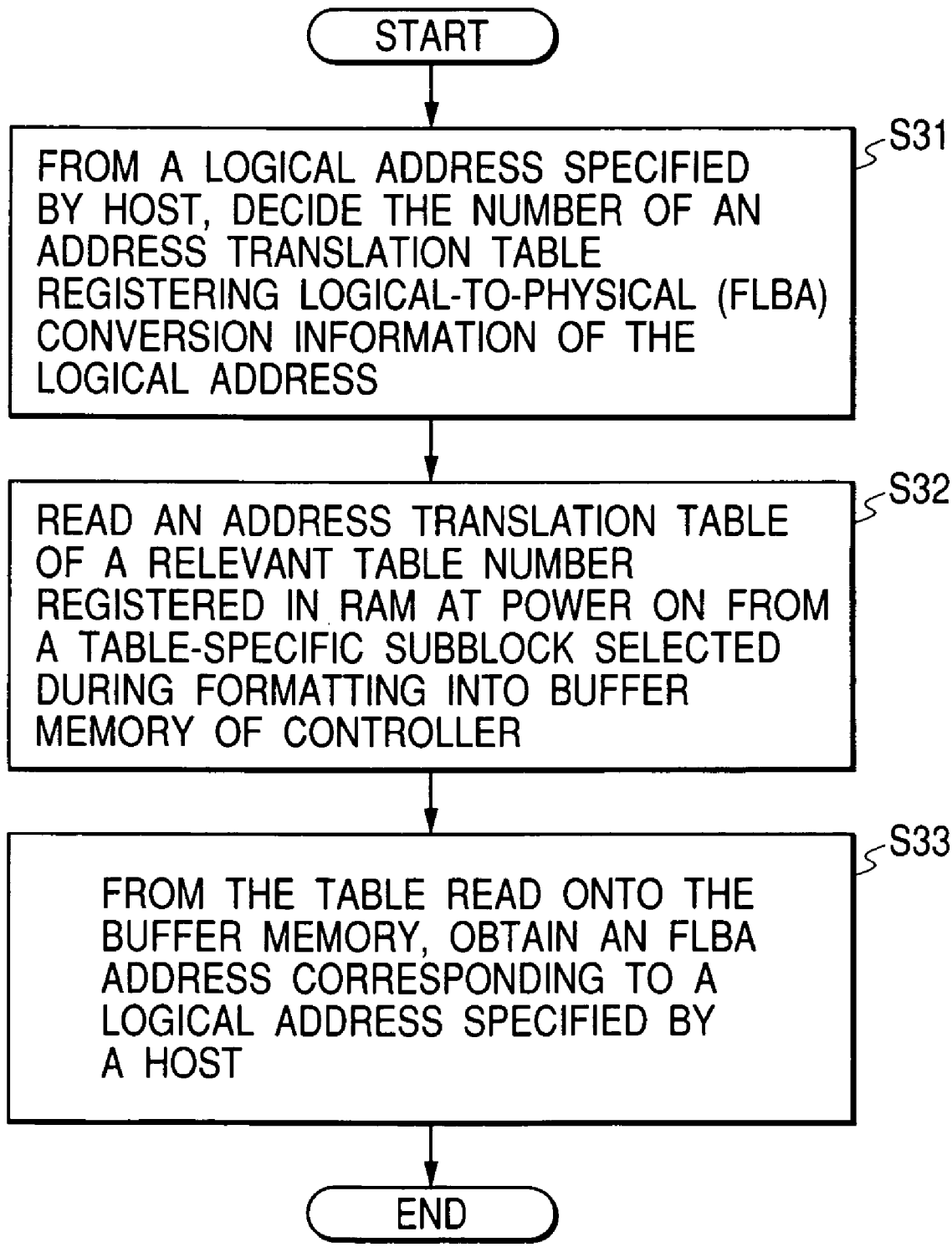
FIG. 11 is a flowchart showing a procedure for translation from logical addresses into physical addresses in a memory card adopting a table method.

FIG. 11 shows a procedure for translation from logical addresses into physical addresses in a memory card adopting a table method. Control based on a flowchart of FIG. 11 is performed by the controller 120.

Upon receipt of a logical address along with a read command and a write command from an external host device, the MPU 121 of the controller 120 decides the number of an address translation table in which logical-to-physical translation information of the logical address is registered (step S31). Next, the MPU 121 refers to the physical address of the address translation table registered in RAM of the MPU or controller buffer at power on from a table-specific subblock selected during formatting of the flash memory 110, reads data of the address translation table from the flash memory 110, and stores it in a predetermined address of the buffer memory of the controller 120 (step S32). Then, the table stored in the buffer memory 124 is consulted to obtain the page address of an inter-bank block chain FLBA corresponding to the logical address specified by the host device (step S33). Thereafter, the page address is used to read or write data from or to the flash memory, depending on the command specified by the host device.

Figure 13:
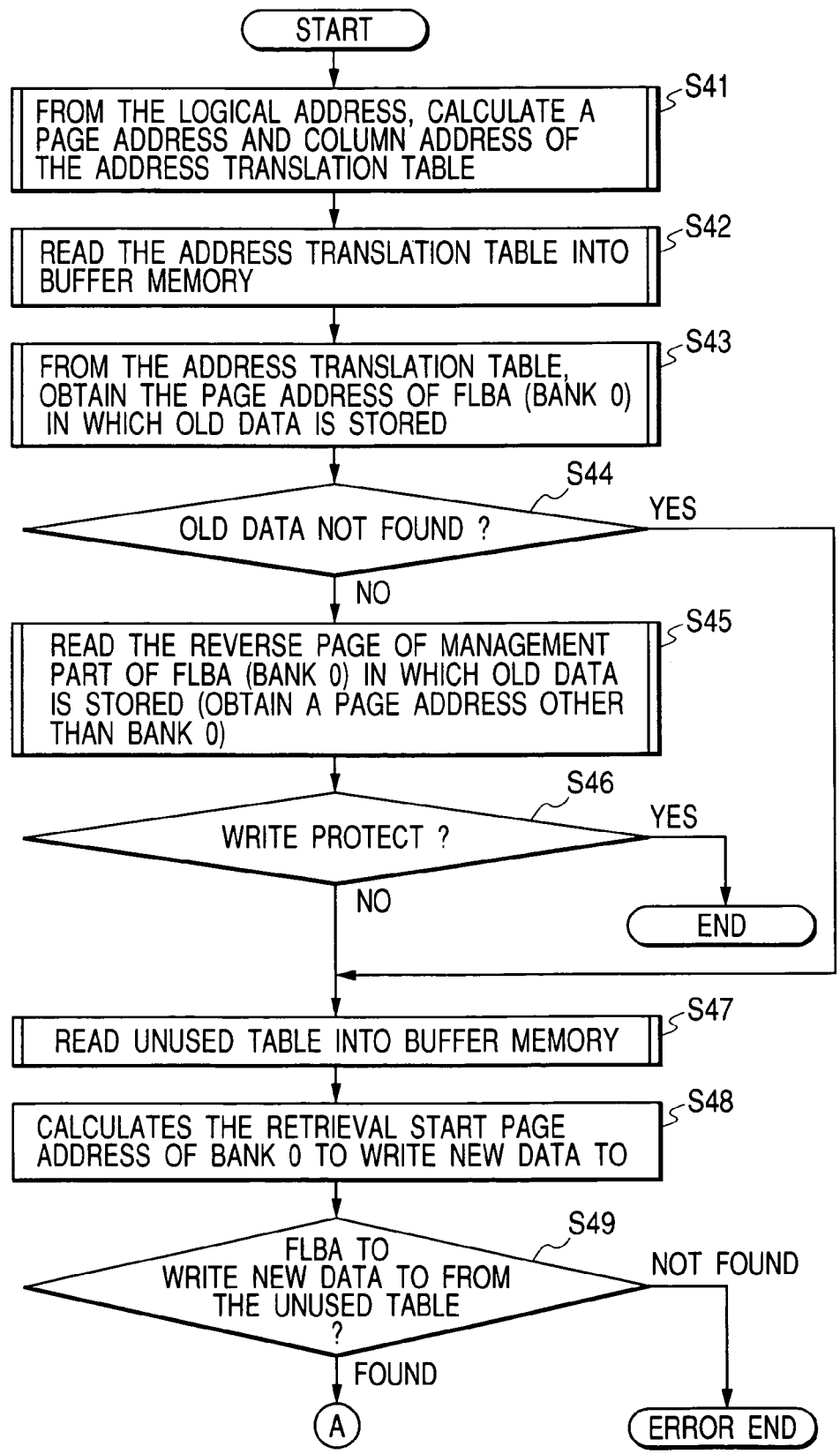
FIG. 13 is a flowchart showing the first half of a procedure for data rewriting in a memory card adopting a table method.
Figure 14:
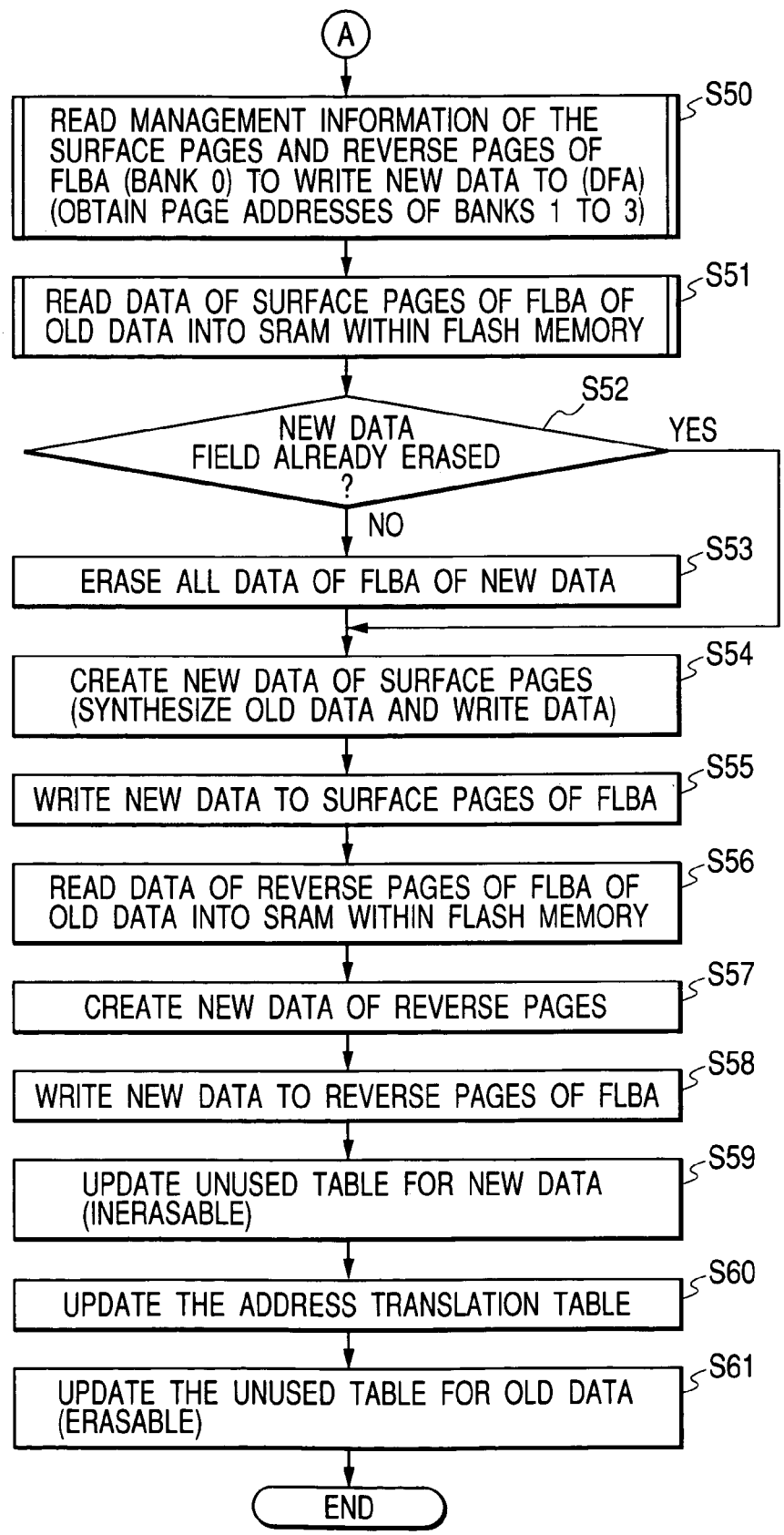
FIG. 14 is a flowchart showing the second half of a procedure for data rewriting in a memory card adopting a table method.
Figure 15:
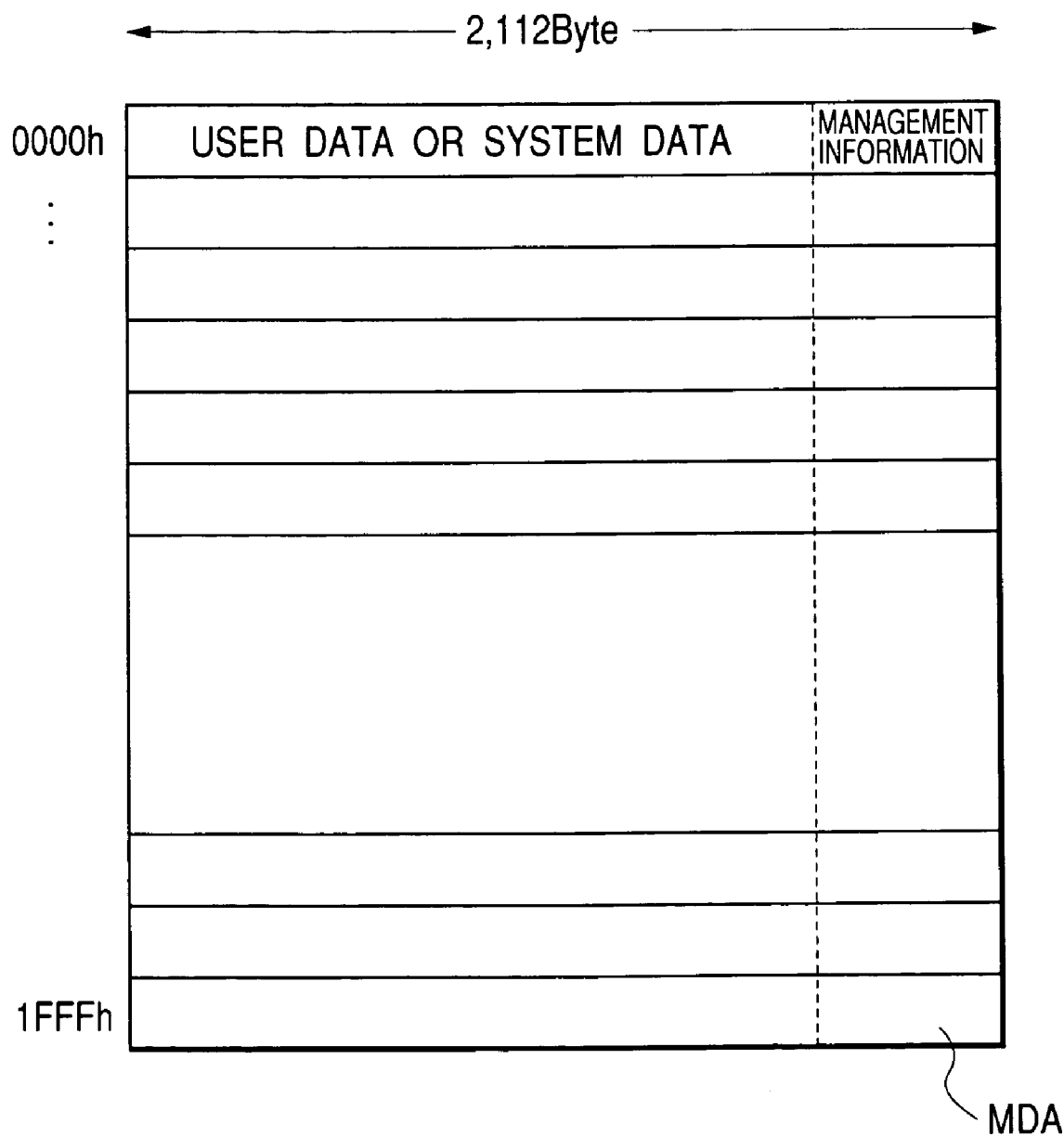
FIG. 15 is a diagram illustrating an address assignment method in a system using a conventional flash memory.

A procedure for writing data to the memory card of the embodiment by adopting the table method will be described with reference to FIGS. 12 to 14.

Figure 12:
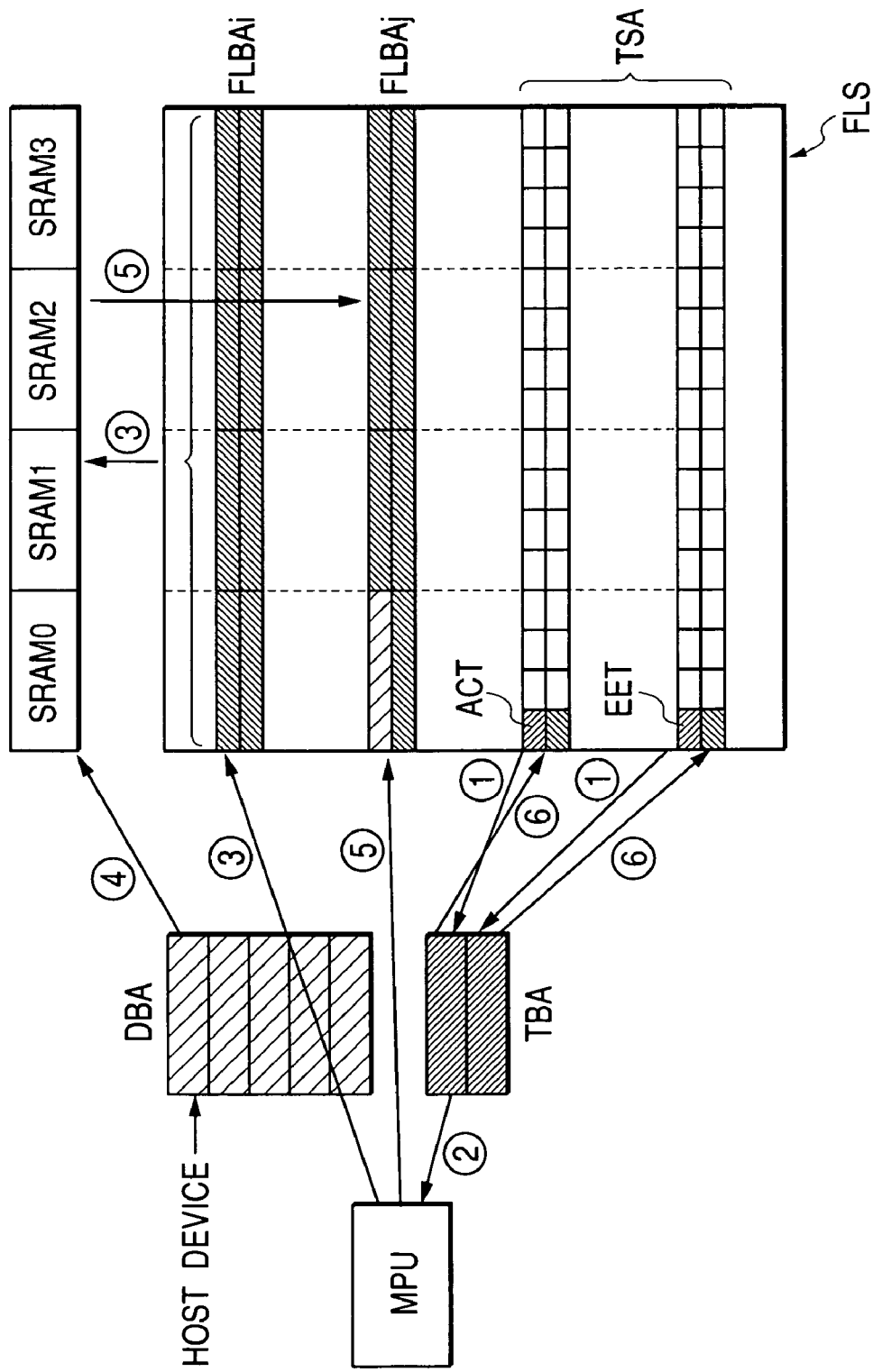
FIG. 12 is a diagram illustrating a procedure for rewriting part of data of the surface page of bank BANK0 of an inter-bank block chain.

FIG. 12 shows an outline of a procedure for rewriting part of data of the surface page of the bank BANK0 of an inter-bank block chain FLBAi.

In FIG. 12, DBA and TBA denote a data buffer area and a table expansion area of the buffer memory 124, respectively; SRAM0 to SRAM3, SRAM buffers for temporarily storing read and write data; FLS, the memory array of the flash memory; TSA, a table storage area; ACT, an address translation table; and EET, an unused table. Circled digits indicate the order of data rewriting operations.

Specifically, as shown in ①, after an address translation table ACT and an unused table EET are read from the memory array FLS into a table expansion area TBA of the buffer memory, as shown in ②, the MPU obtains the block addresses of a block of old data and a block of new data from the table on the buffer. Next, as shown in ③, the block address of old data is fed to the memory array FLS from the MPU, and the old data is read into the SRAM buffers SRAM0 to SRAM3.

As shown in ④, write data from the host device is transferred from the data buffer area DBA to an SRAM buffer (e.g., SRAM0) corresponding to a write position. Then, as shown in ⑤, the block address of new data is fed from the MPU to the memory array FLS and the data of the SRAM buffers SRAM0 to SRAM3 is stored in a new block of the memory array FLS. As shown in ⑥, the block address of the new data is registered in the address translation table ACT and the block of the old data is registered as an erasable block in an unused table EET.

Although part of data can also be rewritten by writing new data to original memory cells, if power is turned off during writing of the new data, old data would be lost. Accordingly, in this embodiment, part of data is rewritten by replacing data of the inter-bank block chain FLBAi containing old data by new data inputted from the outside and writing the replaced data to another inter-bank block chain FLBAj.

Thereby, even if power is turned off during writing of new data or during table updating, it can be prevented that old data is lost or correct data cannot be read. By this arrangement, the number of rewritings to a block to write new data to is checked to perform writing to a block having been less frequently rewritten, thereby making it possible to prevent local deterioration of memory cells caused by concentrated data rewritings to specific pages.

Next, a more detailed procedure for data rewriting will be described with reference to flowcharts of FIGS. 13 and 14.

When a write command is inputted from an external host device, the MPU 121 calculates the page address and column address of an address translation table to be used, based on a logical address inputted from the host device, and uses the calculated addresses to read the address translation table from the flash memory 110 into the buffer memory 124 (steps S41 and S42).

Instead of executing the steps S41 and S42, all address translation tables within the flash memory may be read beforehand into the buffer memory 124 at power on or during other operations. By this arrangement, for example, the tables are updated on the buffer memory 124 and the table data is written back to the flash memory 110 at power off, whereby the number of rewritings to the flash memory can be reduced.

After the address translation table is read in step S42, the table is consulted to obtain the page address of the bank BANK0 of an inter-back block chain FLBA containing a block in which data to be rewritten is stored (step S43). When a post-translation address value of the address translation table is "FFFFh" indicating that there is no corresponding physical address, it means that there is no old data there. Therefore, process is jumped to step S46 from step S44.

When a post-translation address value of the address translation table is not "FFFFh", it means that there is old data in the physical address. Therefore, process goes from step S44 to step S45, where data of the management information storage part of the reverse page of the bank BANK0 of an inter-bank block chain FLBA in which old data is stored is read, and the page addresses of other coupled banks BANK1 to BANK3 are obtained.

In step S46, the write protect flag WPF and the like provided in the management information storage part of the reverse page of, e.g., the bank BANK0 are checked to determine whether or not write protect is applied. When it is determined that write protect is applied, process goes to step S47, where an unused table stored in the flash memory 110 is read and transferred to the buffer memory 124.

Next, the retrieval start page address of the bank BANK0 of an inter-bank block chain FLBA to write new data to is calculated (step S48). The page address is generated at random using a random number generation function or the like. The reason that an address generated is used as a retrieval start page address is that the unused table contains information indicating whether or not each of all blocks may be erased or not, and the use of the table helps to prevent necessary data from being lost due to overwriting in cases where, if a page address generated is unconditionally used as a write address, the page address generated at random specifies a block not permitted to erase. The reason that a retrieval start address is generated at random is to prevent concentrated writing to blocks nearer to the start of banks that would occur if retrieval were to always start from the start of the banks.

After step S48, when an inter-bank block chain FLBA to write new data to is not found as a result of retrieving the unused table by using the retrieval start page address, the processing is terminated due to a write error (step S49). On the other hand, in step S49, when an inter-bank block chain FLBA to write new data to is found, process goes to step S50 of FIG. 14 according to the symbol A.

In step S50, the data of the management information storage parts of the surface pages and reverse pages of the bank BANK0 of an inter-bank block chain FLBA to write new data to is read to determine whether or not the bank is a writable area such as a user data area, and the page addresses of other coupled banks BANK1 to BANK3 are obtained. Thereafter, all data of the surface pages of banks BANK0 to BANK4 of an inter-bank block chain FLBA in which old data is stored is read into the SRAM buffers SRAM0 to SRAM4 (step S51).

It is determined from a flag of the management information read in the step S50 whether or not a block of the inter-bank block chain FLBA to write new data to has been already erased (step S52). If the block has already been erased, process jumps to step S54. Otherwise, in step S53, all data of the data storage part of the banks BANK0 to BANK4 of the inter-bank block chain FLBA to write new data to is deleted, and then process goes to the step S54.

In the step S54, new data of surface pages is created by synthesizing the old data read in the step S51 and the write data from the host device on the SRAM buffers SRAM0 to SRAM4. The old data includes the data of the data storage part of the banks BANK0 to BANK4 of the inter-bank block chain FLBA in which the old data is stored, and the data of the management information storage part. When new data is created, information that needs to be updated, such as an erase completion flag, ECC codes, and the number of erasures is updated by processing of the MPU 121.

Thereafter, the new data created in the step S54 is written to the surface pages of the bank BANK0 of the inter-bank block chain FLBA of the new data and other banks BANK1 to BANK3 coupled with the bank BANK0 (step S55).

Next, all data of the reverse pages of banks BANK0 to BANK4 of the inter-bank block chain FLBA in which the old data is stored is read into the SRAM buffers SRAM0 to SRAM4 (step S56).

New data of reverse pages is created by synthesizing the old data read in the step S56 and the write data from the host device on the SRAM buffers SRAM0 to SRAM4 (step S57). In this case, if the write data is the same as that for the surface pages, the old data of the data storage part and the page addresses of the management information storage part are used as new data without modifications.

If the write data is the same as that for the surface pages, only rewrite target data, of the old data of the data storage part, that has been replaced by the write data is used as new data. Also in this case, the page addresses of the management information storage part are included in the new data. If the management information storage part of the reverse pages is provided with an area for storing ECC codes, the number of erasures, and the like, items of the management information that need to be updated are updated by processing of the MPU 121.

Thereafter, the new data created in the step S57 is written to the surface pages of the bank BANK0 of the inter-bank block chain FLBA of the new data and other banks BANK1 to BANK3 coupled with the bank BANK0 (step S58). Then, the value of the unused table on the block to which the new data has been written is updated from "erasable" to "inerasable" (step S59).

The address translation table is also updated so that a post-translation physical address is updated from the page address of the bank BANK0 of the old data to the page address of the bank BANK0 of the new data (step S60).

Finally, the value of the unused table on the block in which the old data has been stored is updated from "inerasable" to "erasable" (step S61). In this way, since the unused table on the block in which the old data has been stored is updated after the address translation table is updated, even if power is turned off during writing of the new data or during updating of the unused table on the block of the new data, the old data can be stored or reread.

Although the memory card of this embodiment is described with respect to a case where a bank in which inter-block chain information (page addresses), and management information updated frequently such as an erase completion flag are stored is fixed to BANK0, a bank in which the management information is stored may be switched from BANK0 sequentially to BANK1, BANK2, and BANK3. If management information such as the erase completion flag is frequently updated, since blocks concerned must be rewritten every time, the number of rewritings to only the bank BANK0 increases. However, by switching banks in which management information is stored, the number of rewritings can be averaged and local deterioration of memory cells can be curbed.

While the invention made by the present inventor has specifically been described based on the embodiments, it is apparent that the invention is not limited to the embodiments but can be variously modified without departing from the scope thereof. For example, although the embodiments have been described with respect to cases where the present invention is applied to a flash memory whose erase unit is twice a write unit thereof, the present invention can also apply to a flash memory whose erase unit is the same as a write unit thereof.

Specifically, in the embodiments, half of plural memory cells (block) connected to one word line is connected to first local source lines and the remaining half is connected to second local source lines, so that one block is composed of two pages. However, the present invention can also apply to cases where pages and blocks are the same. The present invention can also apply to a flash memory whose erase unit is three times or more a write unit thereof. The present invention can be widely used for a nonvolatile memory whose memory array is configured with plural banks writable in parallel, and a storage device using it.

In the embodiments, the management information storage part of the bank BANK0 stores the page addresses of three banks BANK1 to BANK3 coupled with the bank BANK0. However, alternatively, the management information storage part of any one bank may store the page address of any of other banks, coupled with it, and the management information storage part of the any bank may store the page addresses of other banks coupled with it. In other words, a chain may be configured to consist of two or more stages.

Although the embodiments have been described with respect to a quaternary-valued flash memory capable of storing 2-bit data in one storage element (memory cell), the present invention can also apply to a binary-valued flash memory storing 1-bit data in one storage element, and a multiple-valued flash memory storing data of 3 bits or more.

Although, in the embodiments, a state of a low threshold voltage of memory cells is referred to as an erase state, and a state of a high threshold voltage is referred to as a write state, the present invention can also apply to a flash memory in which a state of a high threshold voltage of memory cells is associated with an erase state, and a state of a low threshold voltage is associated with a write state.

Although the embodiments have been described with respect to an AND-type or NOR-type flash memory in which plural storage elements are connected in parallel between a bit line and a source line, the present invention can also apply to a so-called NAND-type flash memory in which storage elements are serially connected, and a nonvolatile memory having memory cells of MONOS structure.

Although the invention made by the inventor has been described with respect to a case where it is applied to a memory card using a flash memory, which is an application field of the present invention, the present invention is not limited to the case. The present invention can be widely used for a memory card using EEPROM and other semiconductor memories having nonvolatile storage elements that store information by changing threshold voltages by applying voltages, and a storage device called a memory module that mounts plural nonvolatile memories on one printed wiring board.

Effects obtained by representative examples of the invention disclosed in this application will be briefly described.

According to the present invention, in a memory system using a nonvolatile semiconductor storage device such as a flash memory having plural banks, since chains of blocks containing no defective bits are formed, the number of blocks that contain no defective bits but are not used can be reduced and a substantial storage capacity can be increased.

Simply by reading management information from blocks of a bank having a management information storage area, while other coupled blocks can be recognized, in comparison with cases where an address translation table for translating logical addresses into physical addresses with respect to all blocks is provided, table size can be made smaller, and reduction in a substantial storage capacity of memory in the case of storing the table in a flash memory can be prevented.

What is claimed is:

1. A storage device comprising:
   a nonvolatile memory; and
   a control circuit,
   wherein said nonvolatile memory has a plurality of memory blocks, each of which has a plurality of sub memory blocks comprising a plurality of nonvolatile memory cells, and is capable of performing programming to a first sub memory block within a first memory block and a second sub memory block within a second memory block in parallel,
   wherein said control circuit controls programming to said nonvolatile memory in accordance with address information and data issued from an outside device,
   wherein said first sub memory block of said first memory block includes a management area, which is used for storing management information and includes an area for storing linking information between said first sub memory block of said first memory block and a corresponding sub memory block of at least one other memory block,
   wherein said control circuit performs control to read said linking information from said first sub memory block of said first memory block in accordance with said address information, and thereafter to program said first sub memory block of said first memory block in accordance with said address information and to said corresponding sub memory block based on said linking information stored in said first sub memory block.

2. A storage device according to claim 1, further comprising a translation table,
   wherein said translation table is used for translating from said address information issued from said outside device to a first physical address for selecting said first sub memory block of said first memory block, and
   wherein said control circuit reads said linking information from said first sub memory block of said first memory block selected by said first physical address translated by said translation table from said address information.

3. A storage device according to claim 2, further comprising a buffer memory,
   wherein said buffer memory is capable of storing data supplied from or supplied to said outside device, and
   wherein said translation table is stored to said nonvolatile memory before power supplying is turned off, and is stored to said buffer memory after power supplying is turned on.

4. A storage device according to claim 3,
   wherein said nonvolatile memory cells including in said first sub memory block are coupled to a word line, and
   wherein said selecting of said first sub memory block includes selecting said word line corresponding to said physical address.

5. A storage device according to claim 4,
   wherein when said control circuit detects an error in a nonvolatile memory cell in a selected sub memory block corresponding to said first sub memory block, said control circuit controls changing said selected sub memory block to a different sub memory block in the same memory block and storing linking information of said different sub memory block into said first sub memory block.

6. A storage device according to claim 5,
   wherein in said programming to said first sub memory block, said control circuit controls reading data from said first sub memory block, merging data read from said first sub memory block and new data received from said outside device, and programming to a new first sub memory block a second physical address which is different from said first physical address of said first sub memory block.

7. A storage device according to claim 6,
   wherein said control circuit controls changing said translation table to replace said first physical address of said first sub memory block by said second physical address of said new first sub memory block as a corresponding physical address of said address information received from said outside device, after programming to said new first sub memory block.

8. A storage device according to claim 7,
   wherein said management information includes a first information which indicates, for said first sub memory block and each said corresponding sub memory block by said linking information, whether the sub memory block is already erased.

9. A storage device according to claim 8, further comprising a plurality of volatile memories,
   wherein each of said volatile memories corresponds to one of said memory blocks and is capable of storing program data.

10. A storage device according to claim 9,
    wherein in said programming to said first sub memory block, said control device controls reading data from said first sub memory block to said volatile memory corresponding to said first memory block.

* * * * *